United States Patent [19]

Nozaki et al.

[11] Patent Number: 4,710,971

[45] Date of Patent: Dec. 1, 1987

[54] CHANNEL SELECTING DEVICE FOR CATV TERMINAL UNIT

[75] Inventors: Takashi Nozaki; Takashi Hashimoto, both of Tokyo, Japan

[73] Assignee: Pioneer Electronic Corporation, Tokyo, Japan

[21] Appl. No.: 767,448

[22] Filed: Aug. 20, 1985

[30] Foreign Application Priority Data

Aug. 20, 1984 [JP] Japan ................................ 59-173521

[51] Int. Cl.⁴ .............................................. H04B 1/16
[52] U.S. Cl. .................................... 455/179; 455/185; 455/186; 455/4
[58] Field of Search .................... 455/179, 185, 186, 4, 455/131, 158; 358/114, 122, 349

[56] References Cited

U.S. PATENT DOCUMENTS

| 4,110,695 | 8/1978 | Klank et al. | 455/186 |
| 4,155,043 | 5/1979 | Sekamoto | 455/185 |
| 4,209,751 | 6/1980 | Sakamoto | 455/186 |
| 4,392,246 | 7/1983 | Niioka et al. | 455/158 |

FOREIGN PATENT DOCUMENTS 2034141  3/1980  United Kingdom ................ 455/186

*Primary Examiner*—Robert L. Griffin
*Assistant Examiner*—Elissa Seidenganz
*Attorney, Agent, or Firm*—Sughrue, Mion, Zinn, Macpeak, and Seas

[57] ABSTRACT

In a channel selecting device for a CATV terminal unit, a channel code table is stored in a ROM of the terminal unit, and only a code arrangement in the channel code table is written in a RAM, whereby the rewriting data is compressed, the time required for the data writing operation is reduced, and the area occupied by the RAM decreased.

3 Claims, 6 Drawing Figures

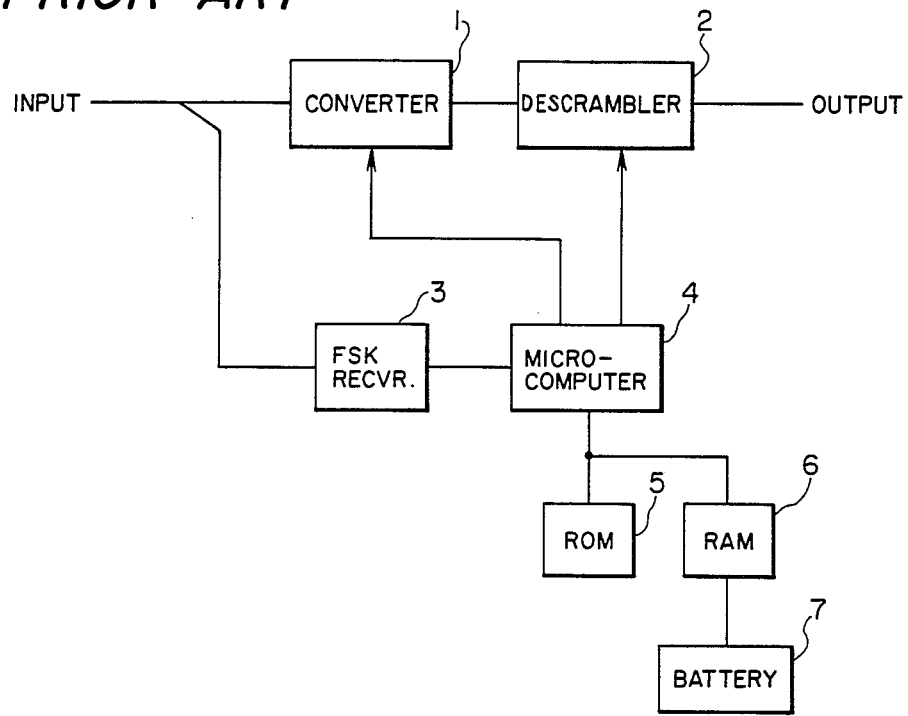

FIG. 4

| CODE NO. | CH DATA | CODE NO. | CH DATA |
|---|---|---|---|
| 0 | 2ch  DATA | 26 | DDCH  DATA |
| 1 | 3 | 27 | EECH |
| 2 | 4 | | |
| 3 | 5 | 38 | VVCH |
| 4 | 6 | 39 | WWCH |
| 5 | 7 | 3A | AAA |
| 6 | 8 | 3B | BBB |
| 7 | 9 | 3C | CCC |
| 8 | 10 | | |
| 9 | 11 | ⋮ | ⋮ |
| A | 12 | | |
| B | 13 | 63 | |
| C | A | 64 | |
| D | B | | |
| 1A | O | | UN DEFINE CH |
| 1B | P | | |
| | | 7F | |
| 21 | V | | |
| 22 | W | | |
| 23 | AA | | |
| 24 | BB | | |
| 25 | CC | | |

FIG. 5

| DISP CH | RF CH |
|---|---|
| 1 | A CH |
| 2 | 2 CH |
| 3 | 3 |
| 4 | 4 |
| 5 | 5 |
| 6 | 6 |
| 7 | 7 |
| 8 | 8 |
| 9 | 9 |
| 10 | 10 |
| 11 | 11 |
| 12 | 12 |
| 13 | 13 |
| 14 | B |
| 15 | C |
| 16 | D |
| 17 | E |
| 18 | F |
| 19 | G |
| 20 | H |
| 21 | I |
| 22 | J |
| 23 | K |
| 24 | L |
| 25 | M |
| 26 | N |
| 27 | O |
| 28 | P |
| 29 | AA |
| 30 | BB |
| 31 | CC |
| 32 | VV |
| 33 | WW |
| 34 | AAA |
| 35 | BBB |
| 36 | CCC |

FIG. 6

| NUMBER OF BYTES | DATA | |
|---|---|---|
| 1 | 8 CH | A ch |
| 2 | 00 H | 2 |
| 3 | 0B H | 13 |
| 4 | 0D H | 8 |
| 5 | 1B H | P |
| 6 | 23 H | AA |
| 7 | 25 H | CC |
| 8 | 38 H | VV |
| 9 | 3C H | CCC |
| 10 | FF H | END |

CHANNEL SELECTING DEVICE FOR CATV TERMINAL UNIT

BACKGROUND OF THE INVENTION

The present invention relates to CATV systems, and more particularly to a channel selecting device for CATV terminal units in which received channels can be indicated by the display of an arbitrarily selected number.

A conventional channel selecting device for CATV terminal units is embodied in the system shown in FIG. 1. In FIG. 1, a CATV signal is applied to an INPUT terminal, and the TV signal is provided at an OUTPUT terminal through a converter 1 and a descrambler 2, which are under the control of a microcomputer 4. An FSK signal is branched from the signal at the INPUT terminal and applied to an FSK signal receiver 3 where it is demodulated. The output signal of the FSK signal receiver is applied as data to the microcomputer 4. The microcomputer 4 is connected through bus lines to a program ROM 5 and a RAM 6 backed up by a battery 7.

In this system, to set the displayed channel numbers with respect to the received channels, an FSK signal is transmitted from the CATV control center indicating this information, and the data of this signal, demodulated by the FSK signal receiver 3, is stored as a table in the RAM 6 under the control of the microcomputer 4.

For example, if the subscriber operates a remote console to select displayed channel "33", the microcomputer 4 refers to the table stored in the RAM 6 to determine the signal of which received channel should be passed to the television receiver, here assumed to be that of a channel WWCH, and thus tunes the converter 1 to pass the signal from the channel WWCH to the television receiver. If the channel WWCH has been scrambled, a descramble signal is applied to a cause the descrambler 2 to descramble the TV signal.

In the above-described system, a data string as long as 15 bits, for instance, must be stored for each of the channels which can be received; that is, a considerably large quantity of data must be stored. Accordingly, the reading and writing of this data require a relatively long period of time, and the RAM necessarily must have a large capacity, and hence it occupies a large area.

SUMMARY OF THE INVENTION

In view of the foregoing, the invention provides a channel selecting device for a CATV terminal unit in which a channel code table is stored in a ROM of the terminal unit, and only a code arrangement in the channel code table is stored in a RAM, whereby the rewritten data is compressed, the writing time is decreased, and the area occupied by the RAM is reduced.

The foregoing object and other objects of the invention have been achieved by the provision of a channel selecting and displaying device for a CATV terminal unit in which the displayed channels can be set with respect to the received channels, in which, according to the invention, in the case where a microcomputer performs channel selection control, a channel code table is stored in a ROM, and only a code arrangement in a channel code table is written in a memory, the contents of which can be externally rewritten, with respect to the displayed channels.

The nature, principle and utility of the invention will become more apparent from the following detailed description when read in conjunction with the accompanying drawings, in which like parts are designed by like reference numerals of characters.

BRIEF DESCRIPTION OF THE DRAWINGS

In the accompanying drawing:

FIG. 1 is a block diagram showing a conventional channel selecting device for a CATV terminal unit;

FIG. 2 is a table indicating the contents of a RAM in FIG. 1;

FIG. 4 is a table showing a channel arrangement in the system of the invention;

FIG. 5 is a table indicating the contents of a RAM in FIG. 4; and

FIG. 6 shows a chart indicating a memory content of a compressed RAM.

DESCRIPTION OF THE PREFERRED EMBODIMENTS

Figure 3:
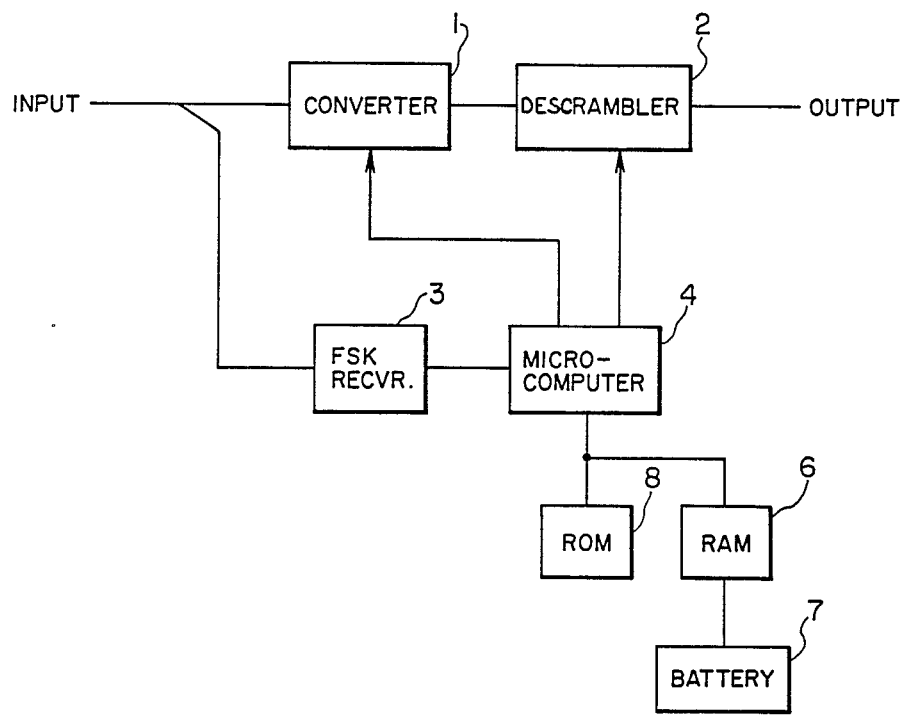
FIG. 3 is a block diagram showing a channel selecting device for a CATV terminal unit according to this invention.

A preferred embodiment of the invention will be described with reference to FIGS. 3 to 6.

In FIG. 3, reference numeral 8 designates a ROM which is provided in place of the ROM 5 in FIG. 1. In the ROM 8 is stored a program and a channel code table. The other circuit elements are the same as those in the conventional system of FIG. 1. A table of seven-bit code numbers and PLL data as shown in FIG. 4, for instance, is included in the data in the ROM 8.

It is assumed that the CATV system employs a channel arrangement as shown in FIG. 5. In this case, only the codes for the first and last of continuous channels are transmitted to the terminal unit from the CATV control center. By "continuous" channels is herein channels which are transmitted over the same RF (radio frequency) channel as that displayed. In the case where channels are not continuous, since the code is of seven bits, the code is written by using eight bits with the MSB (most significant bit) as a "1" so that a "one-channel, one-byte" expression is employed.

FIG. 6 shows an example of a compression of the contents of the data of FIG. 5. The displayed channel is not continuous with the channel A, and therefore an MSB "1" is added to the code "0CH" of the channel A. As the channel "2" through "13" (2CH to 13CH) of "8CH" are continuous, codes for the channels "2" and "13" set to "00H" and "0BH", respectively. Similarly, "0DH", "1BH", "23H", "25H", "38H", and "3CH" are determined. Finally, a finish code "FF" is added at the end. In this case, the data are compressed into 10 bytes of data, which are written in the terminal unit RAM.

When the user operates the terminal unit to select a channel, its ordinary code is obtained from the table in the RAM, and the channel data is obtained from the table in the RAM, and the channel data is obtained from the table (FIG. 4) in the ROM. Thus, the converter 1 is tuned to the desired channel.

In the above-described embodiment, a RAM with a battery backup is employed as the memory the contents of which can be rewritten; however, it may be replaced by an EAROM (erasable and alterable read-only memory).

Furthermore, in the above-described embodiment, each channel code is composed of seven bits; however, if the number of channels is smaller, it may be composed of less than seven bits, and if the number of channels is larger, it may be composed of more than seven bits.

In addition, in the above-described embodiment, in the case when the channels are not continuous, the MSB is set to "1"; however, the MSB may be maintained unchanged and the same code employed again.

In the case where the displayed channel is not the first channel, the display start channel can be written in a part of the RAM area.

In the case where some of the displayed channels are not used, all the channels can be set by a method in which for instance, with code numbers 64 through 7F as undefined channels as shown in FIG. 4, the codes of these channels are set.

Furthermore, instead of the FSK signal, an external port may be used through data communication to rewrite the data.

As is apparent from the above description, in the channel selecting device of the invention, the table of channel data corresponding to code numbers is stored in the ROM, and the compression codes thereof are written in the RAM. Therefore, the area occupied by the RAM is reduced. Furthermore, as the data can be reduced in length, the time required for writing the data can be reduced.

In more detail, is assumed that channel data has been stored in the ROM of the terminal unit in the order shown in FIG. 4. If the subscriber (operator) operates a channel up key, the channels can be observed in that order. The invention provides a method of changing the order of the channels.

Heretofore, the central facility has applied a rewriting instruction to the RAM 6 in order to change the channel order. However, the conventional method is disadvantageous because a considerably large quantity of data must be handled.

In order to overcome this difficulty, in accordance with the invention, a ROM having channel data as shown in FIG. 4 is provided, and the channel data to be used are shifted to the RAM from the center. In this case, all the channel data codes are not specified; that is, for continuous channels, the fact of continuity is taken advantage of.

Channel data as shown in FIG. 4 is stored in the ROM 8. It is required to arrange the channel data in the channel order as shown in FIG. 5.

In FIG. 5, the channel A is at the top. The channel A is not at the top in FIG. 4; that is, in FIG. 4, the channel A is next to the channel 13 and is stored as a code number "C". Accordingly, the transmission data should include "C"; however, the channel A is not continuous with the next channel. Therefore, an MSB of "1" is set at the top of eight-bit transmission data as shown below:

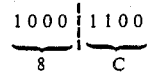

Accordingly, the transmission data "8C" is shown in FIG. 6.

Referring back to FIG. 5, the channel A is followed by the channels 2 through 13. These channels 2 through 13 are continuous in the data train of the ROM 8 in FIG. 4. Therefore, the code number "00" for the channel 2 and the code number "0B" for the channel 13 are transmitted as transmission data. Similarly, the channels B through P are continuous, and therefore code numbers "0D" and "1B" is the ROM 8 are transmitted. Finally, an end code "FF" is transmitted.

Thus, in the data transmitted system of the invention, the continuity of channels in the data table stored in the ROM 8 is utilized so that the code numbers for the first and the last ones of the continuous channels are transmitted, and when a channel is not continuous with the next channel, an MSB of "1" is set at the top of transmission data.

We claim:

1. A channel selecting device of a CATV terminal unit in which displayed channels can be changed with respect to received channels comprising:
   a converter having a CATV signal as its input;
   an FSK receiver having said CATV signal as an input;
   a descrambler receiving the output of said converter as an input;
   a microcomputer for controlling said converter and said descrambler and having the said output signal of said FSK signal receiver as its input;
   a ROM for storing a programmed channel code table, said ROM accessed by said microcomputer;
   a memory containing a compressed code of said channel code table the contents of which can be externally written with respect to said displaying channels, said memory programmed by said microcomputer and the compressed code of said channel code table includes indications of first and last ones of continuous channels.

2. A channel selecting method for a CATV terminal unit in which displayed channels can be changed with respect to received channels, the improvement wherein only data indicative of first and last ones of continuous channels and data indicative of channels other than continuous channels is transmitted from a CATV control center to a terminal unit and stored in a rewritable memory thereof.

3. The channel selecting method of claim 2, wherein data of at least one of each pair of said first and last ones of said continuous channels has a bit set to a value indicating the presence of a respective first or last one of a sequence of continuous channels.

* * * * *